US012618682B2

(12) United States Patent
Blanckenfiell

(10) Patent No.: US 12,618,682 B2
(45) Date of Patent: May 5, 2026

(54) MONITORING MAGNETIC FIELDS

(71) Applicant: VOLVO TRUCK CORPORATION, Gothenburg (SE)

(72) Inventor: Magnus Blanckenfiell, Gothenburg (SE)

(73) Assignee: VOLVO TRUCK CORPORATION, Gothenburg (SE)

( * ) Notice: Subject to any disclaimer, the term of this patent is extended or adjusted under 35 U.S.C. 154(b) by 193 days.

(21) Appl. No.: 18/524,663

(22) Filed: Nov. 30, 2023

(65) Prior Publication Data

US 2024/0192002 A1 Jun. 13, 2024

(30) Foreign Application Priority Data

Dec. 13, 2022 (EP) ..................................... 22213135

(51) Int. Cl.
| | |
|---|---|
| *G01C 21/34* | (2006.01) |
| *G01R 33/02* | (2006.01) |
| *G08G 1/127* | (2006.01) |
| *G01C 21/08* | (2006.01) |

(52) U.S. Cl.
CPC ......... *G01C 21/3461* (2013.01); *G01R 33/02* (2013.01); *G08G 1/127* (2013.01); *G01C 21/08* (2013.01)

(58) Field of Classification Search
CPC .... G01C 21/34; G01C 21/3461; G01C 21/08; G01R 15/148; G01R 33/02; G01R 33/022; G08G 1/127; G08G 1/164; H04W 4/46; G05D 1/0287
See application file for complete search history.

(56) References Cited

U.S. PATENT DOCUMENTS

| | | |
|---|---|---|
| 2018/0210039 A1 | 7/2018 | Shalev |
| 2019/0018417 A1* | 1/2019 | Tillotson ................ G05D 1/104 |
| 2019/0113346 A1 | 4/2019 | Eitel et al. |
| 2020/0294401 A1 | 9/2020 | Kerecsen |
| 2021/0166323 A1 | 6/2021 | Fields et al. |
| 2023/0139622 A1* | 5/2023 | Srivastava .............. G01S 11/06 |
| | | 356/623 |

FOREIGN PATENT DOCUMENTS

| | | |
|---|---|---|
| CN | 110427025 A | 11/2019 |
| CN | 113835444 A | 12/2021 |
| KR | 20120038184 A | 4/2012 |

OTHER PUBLICATIONS

Extended European Search Report in corresponding European Application No. 22213135.1 dated May 19, 2023 (9 pages).

* cited by examiner

*Primary Examiner* — Son T Le
(74) *Attorney, Agent, or Firm* — Jeffri A. Kaminski; Venable LLP

(57) ABSTRACT

A computer system including a processor device is provided configured to monitor, by acquiring at least one measured magnetic field value from a magnetic-field sensing device of a vehicle, a surrounding magnetic field of the vehicle, record a position at which the magnetic field was monitored, the position being acquired from a position-sensing device of the vehicle and to provide an indication of strength of the magnetic field and said position to other vehicles.

19 Claims, 6 Drawing Sheets

20

10

MONITORING MAGNETIC FIELDS

TECHNICAL FIELD

The disclosure relates generally to monitoring magnetic fields. In particular aspects, the disclosure relates to reporting magnetic fields of an area to other vehicles. The disclosure can be applied in heavy-duty vehicles, such as trucks, buses, and construction equipment. Although the disclosure may be described with respect to a particular vehicle, the disclosure is not restricted to any particular vehicle.

BACKGROUND

Modern vehicles, such as cars or trucks, are commonly equipped with sensors and components on which strong magnetic fields have negative effects. For instance, these sensors are utilized to measure speed, position, pressure, temperature, etc., which measured values are supplied to control systems that are needed for propulsion and control of the vehicle.

Thus, it is important that a vehicle equipped with these sensors is aware of strong magnetic fields surrounding the vehicle such that the sensors e.g., may be bypassed or inactivated.

SUMMARY

According to a first aspect of the disclosure, a computer system is provided comprising a processor device configured to monitor, by acquiring at least one measured magnetic field value from a magnetic-field sensing device of a vehicle, a surrounding magnetic field of the vehicle, record a position at which the magnetic field was monitored, the position being acquired from a position-sensing device of the vehicle and to provide an indication of strength of the magnetic field and said position to other vehicles.

The first aspect of the disclosure may seek to resolve an issue of making a measured magnetic field and associated position available to vehicles. A technical benefit may include to enable the vehicles to plan an alternative route in case a strong magnetic field is measured along a specific route.

According to a second aspect of the disclosure, a computer-implemented method is provided comprising monitoring, by a processor device of a computer system of a vehicle acquiring at least one measured magnetic field value from a magnetic-field sensing device, a surrounding magnetic field of the vehicle, recording, by the processor device, a position at which the magnetic field was monitored, the position being acquired from a position-sensing device of the vehicle and providing, by the processor device, an indication of strength of the magnetic field and said position to other vehicles.

In some examples, the providing of the indication of a strength of the magnetic field and said position comprises providing the indication of a strength of the magnetic field and said position to a remotely located device to which the other vehicles have access. A technical benefit may include that the other vehicles may turn to the remotely located device, being for instance a cloud server, at any appropriate time for an indication of the measured magnetic field and position.

In some examples, the providing of the indication of a strength of the magnetic field and said position comprises providing the indication of a strength of the magnetic field and said position directly to the other vehicles. A technical benefit may include that the indication of the measured magnetic field and position may be sent directly to a designated vehicle.

In some examples, the processor device determines whether the at least one measured magnetic field value exceeds at least one magnetic field threshold value and if so, provides the indication of a strength of the magnetic field and said position to other vehicles. A technical benefit may include that only magnetic fields that are considered strong are reported.

In some examples, the recording of the position is only performed if the at least one measured magnetic field value exceeds at least one magnetic field threshold value. A technical benefit may include that the processing unit is not burdened with recording positions unless strong magnetic fields are monitored.

In some examples, the providing of the indication of a strength of the magnetic field is performed by providing the at least one measured magnetic field value. A technical benefit may include that other vehicles are given exact measured magnetic field values.

In some examples, the providing of the indication of a strength of the magnetic field is performed by providing a categorization of the strength of the magnetic field. A technical benefit may include that other vehicles are given an explicit indication of the strength of the magnetic field, such as "medium", "strong", "very strong", etc., and therefore is not required to perform a determination of the strength.

In some examples, the providing of an indication of a strength of the magnetic field and said position to other vehicles is performed via a wireless communication device. A technical benefit may include that data may be swiftly and straightforwardly communicated over great distances at any time.

In some examples, the providing of an indication of a strength of the magnetic field and said position to other vehicles is performed via wired connection. A technical benefit may include that data may communicated to e.g., a cloud server once the vehicle stops at a service center for maintenance, electric charging or refueling.

In some examples, the processor device receives from the remotely located device or one or more of the other vehicles, an alert that there is a discrepancy between the provided indication of strength of the magnetic field at said position and the indication of strength of the magnetic field at said position reported by the other vehicles. A technical benefit may include that the vehicle concludes that the magnetic-field sensing device provides inaccurately measured values, or even is faulty.

In some examples, the processor device receives from the remotely located device or one or more of the other vehicles, information that for an upcoming area, strong magnetic fields have been reported by other vehicles.

In some examples, the processor device selects an alternative route or prepare to bypass or inactivate any components sensitive to strong magnetic fields before the upcoming area is arrived at.

A technical benefit may include to enable the vehicle to plan an alternative route in case a strong magnetic field is measured along a specific route by other vehicles and/or inactive any components sensitive to strong magnetic fields.

In some examples, the wireless communication of the wireless communication device is performed utilizing one or more of radio frequency, Bluetooth, or a wi-fi provided by a local router, etc.

In some examples, the wired connection is provided via one or more of a Controller Area Network (CAN) bus, a Local Interconnect Network (LIN) bus or Ethernet, etc.

In some examples, the position-sensing device is configured to be connected to Global Positioning System (GPS).

In some examples, a vehicle is provided comprising the processor device to perform the method of the second aspect.

In some examples, a computer program product comprising program code is provided for performing, when executed by the processor device, the method of the second aspect.

In some examples, a control system is provided comprising one or more control units configured to perform the method of the second aspect.

In some examples, a non-transitory computer-readable storage medium is provided comprising instructions, which when executed by the processor device, cause the processor device to perform the method of the second aspect.

The above aspects, accompanying claims, and/or examples disclosed herein above and later below may be suitably combined with each other as would be apparent to anyone of ordinary skill in the art.

Additional features and advantages are disclosed in the following description, claims, and drawings, and in part will be readily apparent therefrom to those skilled in the art or recognized by practicing the disclosure as described herein. There are also disclosed herein control units, computer readable media, and computer program products associated with the above discussed technical benefits.

BRIEF DESCRIPTION OF THE DRAWINGS

With reference to the appended drawings, below follows a more detailed description of aspects of the disclosure cited as examples.

DETAILED DESCRIPTION

Aspects set forth below represent the necessary information to enable those skilled in the art to practice the disclosure.

Modern vehicles, such as cars or trucks, are commonly equipped with sensors on which strong magnetic fields have negative effects. For instance, these sensors are utilized to measure speed, position, pressure, temperature, etc., which measured values are supplied to control systems that are needed for propulsion and control of the vehicle, for example an engine control module (ECM) for controlling speed and acceleration/deceleration of the vehicle, a transmission control module (TCM) for changing gears, a brake control module (BCM) for controlling braking, etc. In many cases, it is important that the measured values are accurate for safe control of the vehicle. For instance, a gearbox of the truck may use a position sensor being sensitive to magnetic fields.

Figure 1:
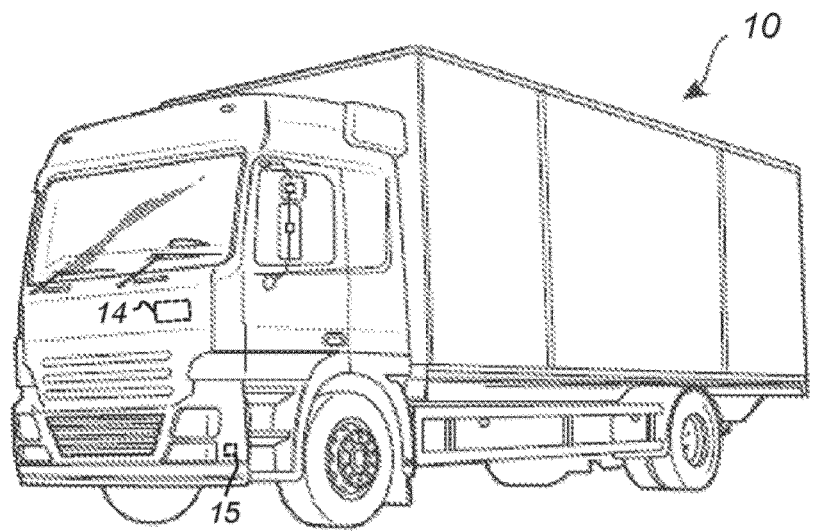
FIG. 1 illustrates a vehicle in the form of a truck in which examples of the present disclosure may be implemented.

FIG. 1 illustrates a vehicle in the form of a truck 10 in which examples of the present disclosure may be implemented, the truck 10 being equipped with a computer system 14, e.g., in the form of a so-called Electronic Control Unit (ECU) controlling operation of the truck 10. In order to measure a magnetic field surrounding the truck 10, the ECU 14 is typically in communicative connection with one or more magnetic-field sensing devices 15 of the truck 10, referred to in the following as a magnetic-field sensor 15.

By collecting measured magnetic-field data from the magnetic-field sensor 15, the ECU 14 may thus determine a surrounding magnetic field potentially affecting the above-mentioned sensors sensitive to strong magnetic fields as the truck 10 travels along a road. If the sensor 15 indicates strong surrounding magnetic fields, suitable actions can be taken; for example to perform open loop control of certain components such as the gearbox and/or temporarily deactivate or bypass the gearbox position sensor or any other sensor which cannot be fully relied upon when being subjected to strong magnetic fields.

Although the vehicle 10 in FIG. 1 is depicted as a heavy-duty truck, examples of the present disclosure may be implemented in other types of vehicles, such as in passenger cars, busses, light-weight trucks, mid-weight trucks, construction equipment, motorcycles, marine vessels, etc.

Figure 2:
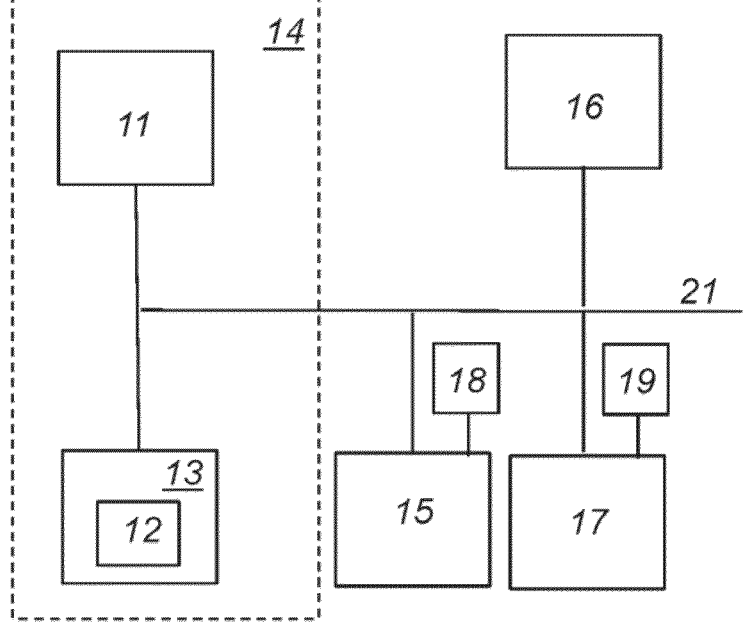
FIG. 2 shows an exemplary system diagram of a computer system with which the truck of FIG. 1 is equipped according to the present disclosure.

FIG. 2 shows an exemplary system diagram of the computer system 14 with which the truck 10 of FIG. 1 is equipped according to an example of the present disclosure. The computer system 14 will in the following be exemplified by an ECU.

The ECU 14 generally comprises a processor device 11 embodied in the form of one or more microprocessors arranged to execute a computer program 12 downloaded to a storage medium 13 associated with the microprocessor, such as a Random Access Memory (RAM), a Flash memory or a hard disk drive. The processor device 11 is arranged to cause the ECU 14 to perform desired operations when the appropriate computer program 12 comprising computer-executable instructions is downloaded to the storage medium 13 and executed by the processor device 11. The storage medium 13 may also be a computer program product comprising the computer program 12. Alternatively, the computer program 12 may be transferred to the storage medium 13 by means of a suitable computer program product, such as a Digital Versatile Disc (DVD) or a memory stick. As a further alternative, the computer program 12 may be downloaded to the storage medium 13 over a network. The processor device 11 may alternatively be embodied in the form of a digital signal processor (DSP), an application specific integrated circuit (ASIC), a field-programmable gate array (FPGA), a complex programmable logic device (CPLD), etc.

In an example of the present disclosure, the ECU 14 is further in communicative connection with a wireless communication device in the form of a wireless transmitter/receiver 16 (commonly referred to as a transceiver) for making the measured values of the surrounding magnetic field 18 available to other vehicles. The transceiver 16 is configured to communicate with remote devices such as e.g., cloud servers, other vehicles and/or appropriate components arranged in the truck 10 being capable of wireless communication. The wireless communication of the transceiver 16 may be performed for instance via radio frequency (RF), Bluetooth, a wi-fi provided by a local router, etc.

The ECU 14 is further in communicative connection with a positioning device 17 of the truck 10, such as a device connected to Global Positioning System (GPS). The positioning device 17 will in the following be referred to as a GPS receiver being capable of acquiring the position 19 of the truck 10.

Communication between the various components illustrated in FIG. 2 may occur via a wired connection 21, e.g., a Controller Area Network (CAN) bus, a Local Interconnect Network (LIN) bus, Ethernet, etc.

A number of scenarios are envisaged for making the magnetic field values measured by the sensor 15 available to other vehicles.

In one example, the ECU 14 communicates the measured magnetic field values and the locations at which the values were recorded via the transceiver 16 to a cloud server to which other vehicles also have access.

In another example, the ECU 14 communicates the measured magnetic field values and the corresponding positions directly via the transceiver 16 to other vehicles.

A benefit of making the measured magnetic field values and the position at which each value was registered available is that other vehicles may consider the information when selecting a route. For instance, another vehicle may consider avoiding routes where strong magnetic fields have been registered, or at least be informed in advance such that sensitive components may be inactivated or bypassed.

Figure 3:
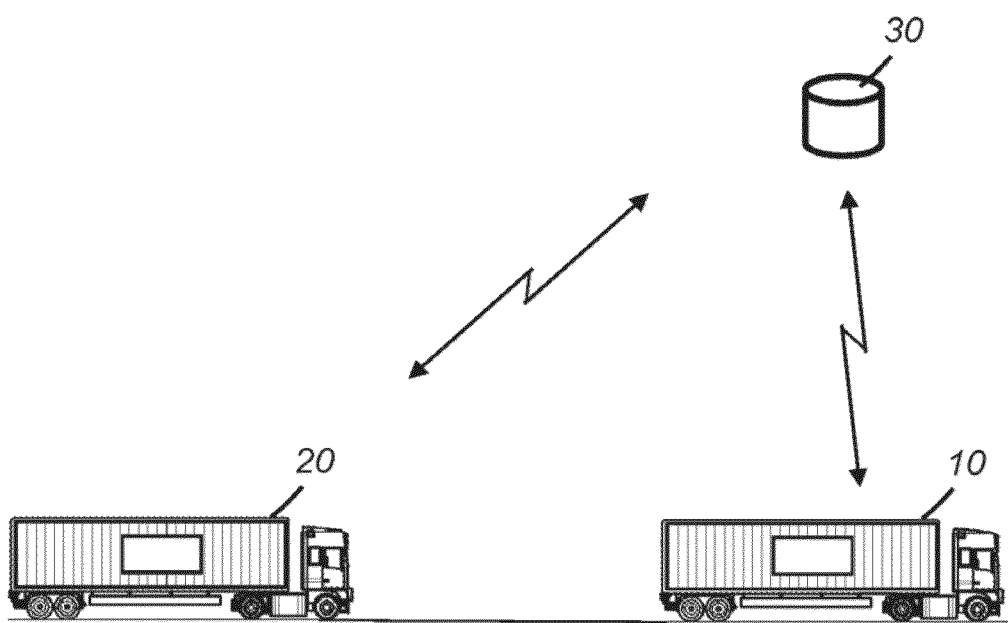
FIG. 3 illustrates an example of the disclosure where a vehicle provides an indication of strength of a measured magnetic field and corresponding position to a cloud server.

FIG. 3 illustrates an example where the truck 10 makes the magnetic field values measured by the sensor 15 available to another vehicle 20 via a remotely located device 30 such as a cloud server.

Figure 4:
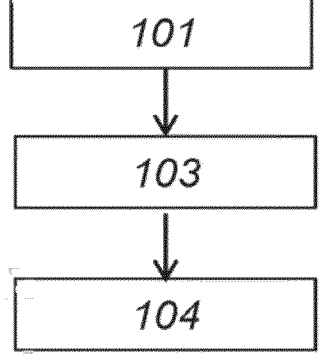
FIG. 4 shows a flowchart illustrating an example method according to the present disclosure.

Reference is further made to FIG. 4 showing a flowchart illustrating a method of making the measured magnetic field values available to the other vehicle 20 in an example.

In 101, the processor device 11 of the ECU 14 monitors a surrounding magnetic field of the vehicle 10 by continuously acquiring measured values from the sensor 15.

While the sensor 15 measures the surrounding magnetic field, the processor device 11 will in 102 register a current position of the truck 10 for each measured magnetic field value by acquiring the current position from the GPS receiver 17.

In 103, the processor device 11 provides, via the transceiver 16, an indication of a strength of the magnetic field and the position to the other vehicle 20, in this example via cloud server 30 to which the other vehicle 20 has wireless access.

In this example, the processor device 11 provides the measured value of the magnetic field along with the position where the value was measured by the sensor 15. Other options are possible, as will be discussed.

For illustrational purposes, the truck 10 and the other vehicle 20 are located close to each other but in practice, the other vehicle 20 may be located hundreds or thousands of miles from the reported position.

Sharing an indication of the strength of the monitored magnetic field with other vehicles is beneficial since other drivers are warned in advance before area with strong magnetic fields are encountered and alternative routes can be selected, or at least the driver knows in advance that such an area will be encountered, and sensitive vehicle components may thus be inactivated or bypassed.

Figure 5:
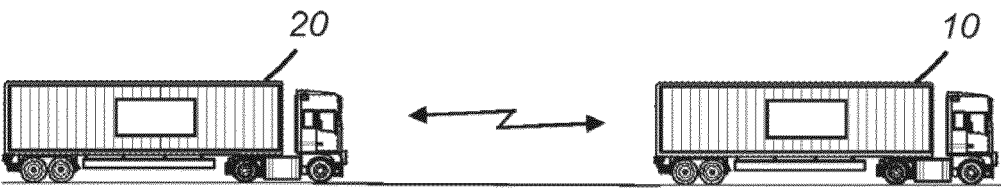
FIG. 5 illustrates an example of the disclosure where a vehicle provides an indication of strength of a measured magnetic field and corresponding position directly to another vehicle.

While FIG. 3 illustrates an example where the truck 10 makes the magnetic field values measured by the sensor 15 available to the other vehicle 20 via the cloud server 30, it may also be envisaged that the measured value of the magnetic field along with the position where the value was measured by the sensor 15 is provided directly to the other vehicle 20 via the transceiver 16, as shown in FIG. 5.

While the communication of the measured value of the magnetic field along with the position is illustrated to occur via the transceiver 16 in FIGS. 3 and 5, it may be envisaged that the communication occurs via a wired connection 21 such as a CAN bus. For instance, once the truck 10 stops at a service center for maintenance, electric charging or refueling, the measured magnetic field values and the associated positions may be transferred from the truck 10 to the service center via the wired connection 21.

Figure 6:
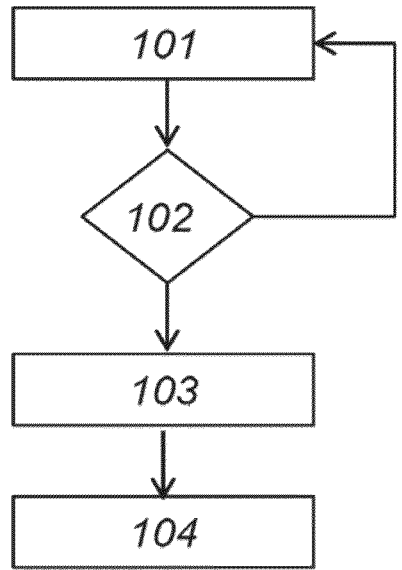
FIG. 6 shows a flowchart illustrating another example method according to the present disclosure.

In another example, with reference to the flowchart of FIG. 6, not all measured magnetic field values are transferred to the other vehicle 20/cloud server 30, but only values which are considered to represent a strong magnetic field, such as measured values exceeding a magnetic field threshold T. Thus, if the value of the measured magnetic field exceeds the threshold value T in 102, the position is recorded in 103 and the value and the position is provided to the other vehicle 20/cloud server 30 in 103. If not, no reporting is undertaken by the truck 10.

Hence, in an example, the recording of the position of the measure magnetic field value is performed only if the measured magnetic field value exceeds the magnetic field threshold value T.

It may be envisaged that a plurality of magnetic field threshold values is utilized, where e.g., a first threshold value T1 indicates a medium strength magnetic field, a second threshold value T2 indicates a strong magnetic field and a third threshold value T3 indicates a very strong magnetic field, and so on. Thus, a categorization of the strength of the magnetic field may be reported rather than actually measure values.

Figure 7:
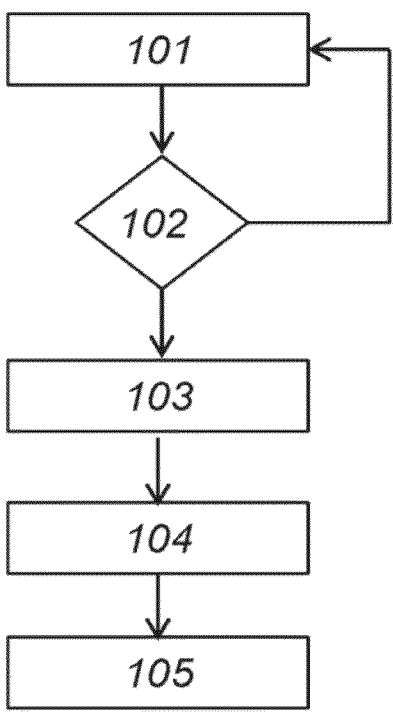
FIG. 7 shows a flowchart illustrating a further example method according to the present disclosure.

In a further example, with reference to the flowchart of FIG. 7, after having provided the cloud server 30 with the measured magnetic field values in 104, the cloud server 30 may conclude that the reported values are not in compliance with magnetic field values reported by other vehicles for this particular position and alert the truck 10 in 105 that there is a discrepancy between the values measured by the truck 10 and those reported by the other vehicles. This is beneficial since an operator of the truck 10 may perform maintenance of the magnetic field sensor 15 to investigate if the sensor provides inaccurately measured values.

As is understood, the alert in 105 that there is a discrepancy between the values measured by the truck 10 and those reported by the other vehicles may alternatively be received from another vehicle 20 in case the truck 10 is in direct communication with such vehicle.

Figure 8:
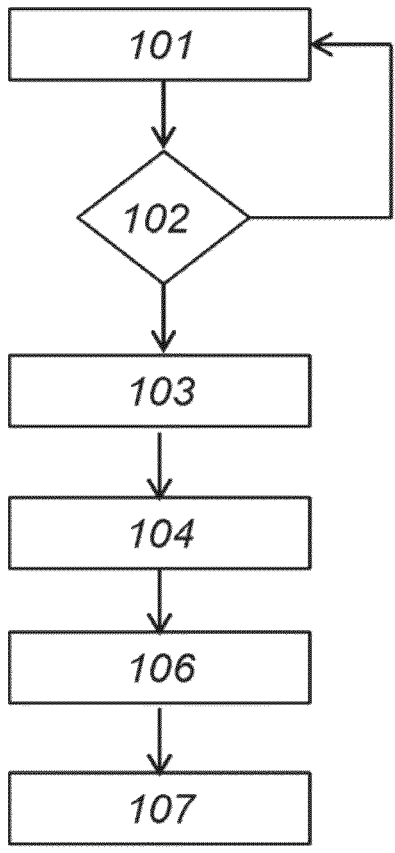
FIG. 8 shows a flowchart illustrating another example method according to the present disclosure.

In a further example, with reference to the flowchart of FIG. 8, after having provided the cloud server 30 with the measured magnetic field values and positions in 104, the cloud server 30 may respond in 106 with information that for an upcoming area, strong magnetic fields have been reported (such as exceeding a set threshold value) by other vehicles 20, thus giving the truck 10 the opportunity in 107 to select an alternative route, or at least be prepared to bypass or inactivate any components sensitive to strong magnetic fields before the upcoming area is arrived at. As is understood, 106 and 107 may occur at any time, even when the truck 10 is not actively reporting 104 to the cloud server 30.

As is understood, the response in 106 may alternatively be received from another vehicle 20 in case the truck 10 is in direct communication with such vehicle.

Figure 9:
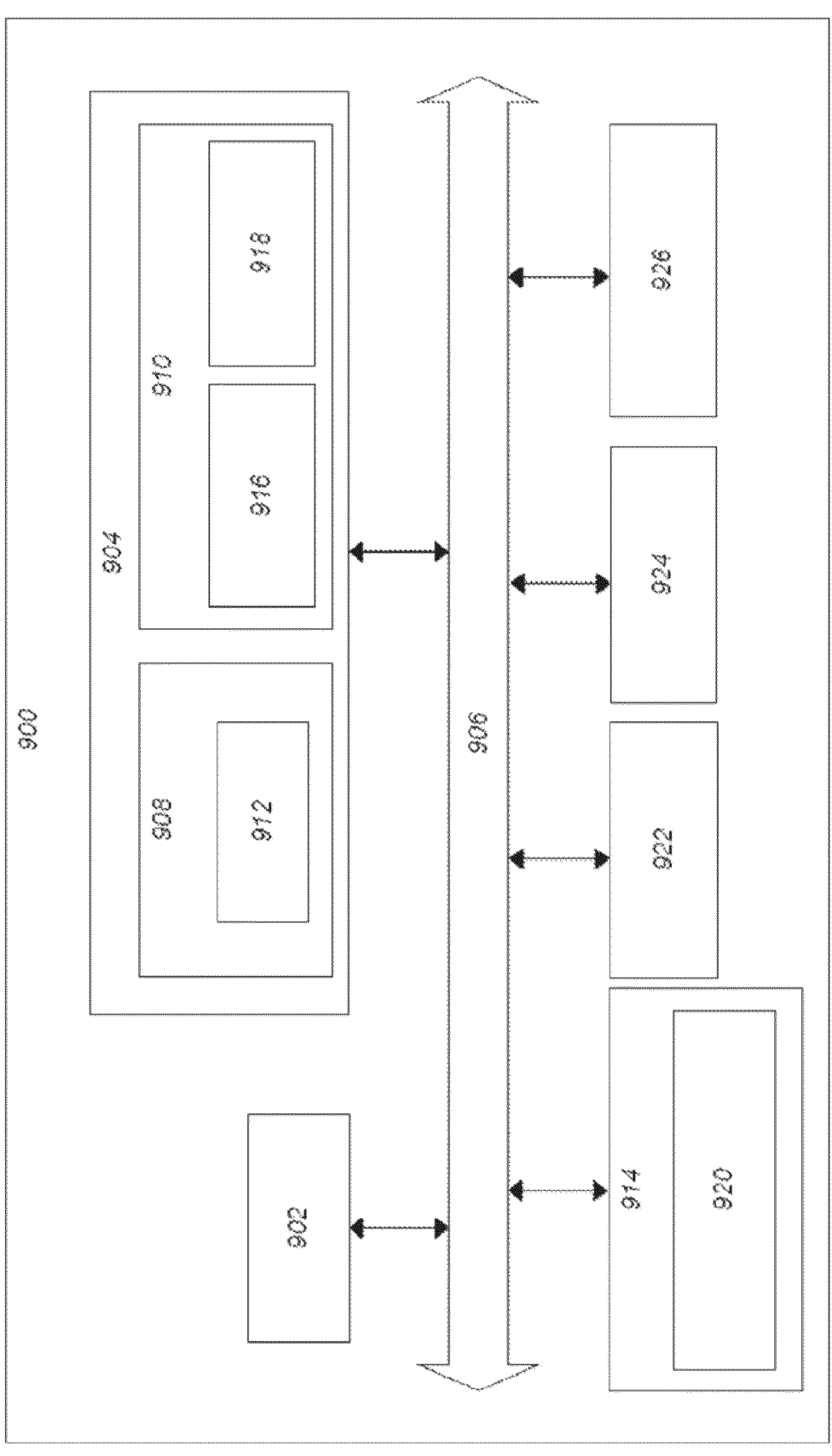
FIG. 9 is a schematic diagram of a computer system for implementing examples disclosed herein.

FIG. 9 is a schematic diagram of a computer system 900 for implementing examples disclosed herein. The computer system 900 is adapted to execute instructions from a computer-readable medium to perform these and/or any of the functions or processing described herein. The computer system 900 may be connected (e.g., networked) to other machines in a LAN, an intranet, an extranet, or the Internet. While only a single device is illustrated, the computer system 900 may include any collection of devices that individually or jointly execute a set (or multiple sets) of instructions to perform any one or more of the methodologies discussed herein. Accordingly, any reference in the disclosure and/or claims to a computer system, computing system, computer device, computing device, control system, control unit, electronic control unit (ECU), processor device, etc., includes reference to one or more such devices to individually or jointly execute a set (or multiple sets) of instructions to perform any one or more of the methodologies discussed herein. For example, control system may include a single control unit, or a plurality of control units connected or otherwise communicatively coupled to each other, such that any performed function may be distributed between the control units as desired. Further, such devices may communicate with each other or other devices by various system architectures, such as directly or via a Controller Area Network (CAN) bus, etc.

The computer system 900 may comprise at least one computing device or electronic device capable of including firmware, hardware, and/or executing software instructions to implement the functionality described herein. The computer system 900 may include a processor device 902 (may also be referred to as a control unit), a memory 904, and a system bus 906. The computer system 900 may include at least one computing device having the processor device 902. The system bus 906 provides an interface for system components including, but not limited to, the memory 904 and the processor device 902. The processor device 902 may include any number of hardware components for conducting data or signal processing or for executing computer code stored in memory 904. The processor device 902 (e.g., control unit) may, for example, include a general-purpose processor, an application specific processor, a Digital Signal Processor (DSP), an Application Specific Integrated Circuit (ASIC), a Field Programmable Gate Array (FPGA), a circuit containing processing components, a group of distributed processing components, a group of distributed computers configured for processing, or other programmable logic device, discrete gate or transistor logic, discrete hardware components, or any combination thereof designed to perform the functions described herein. The processor device may further include computer executable code that controls operation of the programmable device.

The system bus 906 may be any of several types of bus structures that may further interconnect to a memory bus (with or without a memory controller), a peripheral bus, and/or a local bus using any of a variety of bus architectures. The memory 904 may be one or more devices for storing data and/or computer code for completing or facilitating methods described herein. The memory 904 may include database components, object code components, script components, or other types of information structure for supporting the various activities herein. Any distributed or local memory device may be utilized with the systems and methods of this description. The memory 904 may be communicably connected to the processor device 902 (e.g., via a circuit or any other wired, wireless, or network connection) and may include computer code for executing one or more processes described herein. The memory 904 may include non-volatile memory 908 (e.g., read-only memory (ROM), erasable programmable read-only memory (EPROM), electrically erasable programmable read-only memory (EEPROM), etc.), and volatile memory 910 (e.g., random-access memory (RAM)), or any other medium which can be used to carry or store desired program code in the form of machine-executable instructions or data structures and which can be accessed by a computer or other machine with a processor device 902. A basic input/output system (BIOS) 912 may be stored in the non-volatile memory 908 and can include the basic routines that help to transfer information between elements within the computer system 900.

The computer system 900 may further include or be coupled to a non-transitory computer-readable storage medium such as the storage device 914, which may comprise, for example, an internal or external hard disk drive (HDD) (e.g., enhanced integrated drive electronics (EIDE) or serial advanced technology attachment (SATA)), HDD (e.g., EIDE or SATA) for storage, flash memory, or the like. The storage device 914 and other drives associated with computer-readable media and computer-usable media may provide non-volatile storage of data, data structures, computer-executable instructions, and the like.

A number of modules can be implemented as software and/or hard-coded in circuitry to implement the functionality described herein in whole or in part. The modules may be stored in the storage device 914 and/or in the volatile memory 910, which may include an operating system 916 and/or one or more program modules 918. All or a portion of the examples disclosed herein may be implemented as a computer program product 920 stored on a transitory or non-transitory computer-usable or computer-readable storage medium (e.g., single medium or multiple media), such as the storage device 914, which includes complex programming instructions (e.g., complex computer-readable program code) to cause the processor device 902 to carry out actions described herein. Thus, the computer-readable program code can comprise software instructions for implementing the functionality of the examples described herein when executed by the processor device 902. The processor device 902 may serve as a controller or control system for the computer system 900 that is to implement the functionality described herein.

The computer system 900 also may include an input device interface 922 (e.g., input device interface and/or output device interface). The input device interface 922 may be configured to receive input and selections to be communicated to the computer system 900 when executing instructions, such as from a keyboard, mouse, touch-sensitive surface, etc. Such input devices may be connected to the processor device 902 through the input device interface 922 coupled to the system bus 906 but can be connected through other interfaces such as a parallel port, an Institute of Electrical and Electronic Engineers (IEEE) 994 serial port, a Universal Serial Bus (USB) port, an IR interface, and the like. The computer system 900 may include an output device interface 924 configured to forward output, such as to a display, a video display unit (e.g., a liquid crystal display (LCD) or a cathode ray tube (CRT)). The computer system 900 may also include a communications interface 926 suitable for communicating with a network as appropriate or desired.

The operations described in any of the exemplary aspects herein are described to provide examples and discussion. The operations may be performed by hardware components, may be embodied in machine-executable instructions to cause a processor to perform the operations, or may be performed by a combination of hardware and software. Although a specific order of method operations may be shown or described, the order of the operations may differ. In addition, two or more operations may be performed concurrently or with partial concurrence.

The terminology used herein is for the purpose of describing particular aspects only and is not intended to be limiting of the disclosure. As used herein, the singular forms "a," "an," and "the" are intended to include the plural forms as well, unless the context clearly indicates otherwise. As used herein, the term "and/or" includes any and all combinations of one or more of the associated listed items. It will be further understood that the terms "comprises," "comprising," "includes," and/or "including" when used herein specify the presence of stated features, integers, actions, operations, elements, and/or components, but do not preclude the presence or addition of one or more other features, integers, actions, operations, elements, components, and/or groups thereof.

It will be understood that, although the terms first, second, etc., may be used herein to describe various elements, these elements should not be limited by these terms. These terms are only used to distinguish one element from another. For example, a first element could be termed a second element, and, similarly, a second element could be termed a first element without departing from the scope of the present disclosure.

Relative terms such as "below" or "above" or "upper" or "lower" or "horizontal" or "vertical" may be used herein to describe a relationship of one element to another element as illustrated in the Figures. It will be understood that these terms and those discussed above are intended to encompass different orientations of the device in addition to the orientation depicted in the Figures. It will be understood that when an element is referred to as being "connected" or "coupled" to another element, it can be directly connected or coupled to the other element, or intervening elements may be present. In contrast, when an element is referred to as being "directly connected" or "directly coupled" to another element, there are no intervening elements present.

Unless otherwise defined, all terms (including technical and scientific terms) used herein have the same meaning as commonly understood by one of ordinary skill in the art to which this disclosure belongs. It will be further understood that terms used herein should be interpreted as having a meaning consistent with their meaning in the context of this specification and the relevant art and will not be interpreted in an idealized or overly formal sense unless expressly so defined herein.

It is to be understood that the present disclosure is not limited to the aspects described above and illustrated in the drawings; rather, the skilled person will recognize that many changes and modifications may be made within the scope of the present disclosure and appended claims. In the drawings and specification, there have been disclosed aspects for purposes of illustration only and not for purposes of limitation, the scope of the inventive concepts being set forth in the following claims.

What is claimed is:

1. A computer-implemented method, comprising:
monitoring, by a processor device of a computer system of a vehicle acquiring at least one measured magnetic field value from a magnetic-field sensing device, a surrounding magnetic field of the vehicle;
recording, by the processor device, a position at which the magnetic field was monitored, the position being acquired from a position-sensing device of the vehicle;
providing, by the processor device, an indication of strength of the magnetic field and said position to other vehicles; and
receiving, by the processor device from a remotely located device or one or more of the other vehicles, information that for an upcoming area, strong magnetic fields have been reported by other vehicles.

2. The computer-implemented method of claim 1, wherein the providing of the indication of a strength of the magnetic field and said position comprises providing the indication of a strength of the magnetic field and said position to a remotely located device to which the other vehicles have access.

3. The computer-implemented method of claim 1, wherein the providing of the indication of a strength of the magnetic field and said position comprises providing the indication of a strength of the magnetic field and said position directly to the other vehicles.

4. The computer-implemented method of claim 1, further comprising:
determining, by the processor device, whether the at least one measured magnetic field value exceeds at least one magnetic field threshold value; and if so providing the indication of a strength of the magnetic field and said position to other vehicles.

5. The computer-implemented method of claim 4, wherein the recording of the position only is performed when the at least one measured magnetic field value exceeds at least one magnetic field threshold value.

6. The computer-implemented method of claim 1, wherein the providing of the indication of a strength of the magnetic field is performed by providing the at least one measured magnetic field value.

7. The computer-implemented method of claim 1, wherein the providing of the indication of a strength of the magnetic field is performed by providing a categorization of the strength of the magnetic field.

8. The computer-implemented method of claim 1, wherein the providing of an indication of a strength of the magnetic field and said position to other vehicles is performed via a wireless communication device.

9. The computer-implemented method of claim 1, wherein the providing of an indication of a strength of the magnetic field and said position to other vehicles is performed via wired connection.

10. The computer-implemented method of claim 1, further comprising:
receiving, by the processor device from the remotely located device or one or more of the other vehicles, an alert that there is a discrepancy between the provided indication of strength of the magnetic field at said position and the indication of strength of the magnetic field at said position reported by the other vehicles.

11. The computer-implemented method of claim 1, further comprising:
selecting, by the processor device, an alternative route or preparing to bypass or inactivate any components sensitive to strong magnetic fields before the upcoming area is arrived at.

12. The computer-implemented method of claim 8, wherein the wireless communication of the wireless communication device is performed utilizing one or more of radio frequency, Bluetooth, or a wi-fi provided by a local router.

13. The computer-implemented method of claim 9, wherein the wired connection is provided via one or more of a Controller Area Network, CAN, bus, a Local Interconnect Network, LIN, bus, or Ethernet.

14. The computer-implemented method of claim 1, wherein the position-sensing device is configured to be connected to Global Positioning System, GPS.

15. A vehicle comprising the processor device to perform the method of claim 1.

16. A control system comprising one or more control units configured to perform the method according to claim 1.

17. A non-transitory computer-readable storage medium comprising instructions, which when executed by the processor device, cause the processor device to perform the method of claim 1.

18. The computer-implemented method of claim 1, further comprising controlling the vehicle, by the processor device, based on the information.

19. A computer system comprising a processor device configured to:

monitor, by acquiring at least one measured magnetic field value from a magnetic-field sensing device of a vehicle, a surrounding magnetic field of the vehicle;

record a position at which the magnetic field was monitored, the position being acquired from a position-sensing device of the vehicle;

provide an indication of strength of the magnetic field and said position to other vehicles; and receive, by the processor device from a remotely located device or one or more of the other vehicles, information that for an upcoming area, strong magnetic fields have been reported by other vehicles.

* * * * *